United States Patent [19]

Shannon et al.

[11] Patent Number: 5,027,189

[45] Date of Patent: Jun. 25, 1991

[54] INTEGRATED CIRCUIT SOLDER DIE-ATTACH DESIGN AND METHOD

[75] Inventors: Michael J. Shannon; Randolf C. Turnidge, both of Tucson, Ariz.

[73] Assignee: Hughes Aircraft Company, Los Angeles, Calif.

[21] Appl. No.: 463,186

[22] Filed: Jan. 10, 1990

[51] Int. Cl.⁵ .................. H01L 23/48; H01L 29/46; H01L 29/54; H01L 29/62

[52] U.S. Cl. ........................ 357/71; 357/65; 357/68

[58] Field of Search ............ 357/65, 68, 71, 67, 357/66

[56] References Cited

U.S. PATENT DOCUMENTS

| | | | |
|---|---|---|---|
| 3,429,040 | 2/1969 | Miller | 357/68 |
| 3,871,014 | 3/1975 | King et al. | 357/67 |
| 3,893,156 | 7/1975 | Riseman | 357/67 |
| 3,965,567 | 6/1976 | Beerwerth et al. | 29/574 |
| 4,290,079 | 9/1981 | Carpenter et al. | 357/71 |
| 4,504,849 | 3/1985 | Davies et al. | 357/67 |
| 4,840,302 | 6/1989 | Gardner et al. | 228/123 |

Primary Examiner—Rolf Hille
Assistant Examiner—David Ostrowski
Attorney, Agent, or Firm—R. M. Heald; C. D. Brown; W. K. Denson-Low

[57] ABSTRACT

An improved semiconductor device adapted to be metallurgically bonded to a substrate is disclosed. In particular, monolithic microwave integrated circuit (MMIC) device (10) includes a semiconductor wafer (12) having first and second major surfaces and defining at least one via (34) extending therethrough. An electrical circuit is disposed on the first surface of semiconductor wafer (12). In accordance with this invention, MMIC device (10) includes a ground-plane metallization system (32) provided on the second surface of the semiconductor wafer (12). Backside metallization system (32) promotes preferential "de-wetting" of solder within vias (34) to reduce solder failures associated with die-attach processing. Backside metallization systems (32) includes a ground-plane layer (36) and a second layer (38) fabricated from a non-wettable material which is deposited within via (34). Third layer (42) is deposited on second layer (36) but terminates adjacent a peripheral edge of via (34). Third layer (42) promotes wetting outside via (34) during solder die-attach processing.

12 Claims, 1 Drawing Sheet

INTEGRATED CIRCUIT SOLDER DIE-ATTACH DESIGN AND METHOD

BACKGROUND OF THE INVENTION

1. Field of the Invention

This invention relates to semiconductor devices, and more particularly to monolithic microwave integrated circuit (MMIC) designs for improved manufacturability.

2. Discussion

Advances in semiconductor device technology have recently included the improvement in design and manufacturability of integrated devices and systems. For instance, one type of integrated device that recently has received increased attention is monolithic microwave integrated circuits (MMIC) for application in radar detection systems. Radar systems are often used in conjunction with munition and obstacle detection sensor systems for sensing electromagnetic radiation in the microwave frequency band. Specifically, the development of radar for future military defense systems will incorporate the use of electronically steered antennas (ESA) that offer improved beam agility, higher power and increased target range. The ESAs are comprised of an array of passive and active integrated circuits that transmit and receive the electronic radar signals. The transmit/receive (T/R) modules include microwave integrated circuits that are used by the thousands for each radar system and are a significant cost driver in the production of an affordable radar system.

In general, microwave integrated circuit devices are semiconductor devices fabricated by combining one or more semiconductor layers. Of the several conventional methods known, one method of fabricating microwave integrated circuits is to form a junction that includes a transition from a n-type (electron conduction) to a p-type (hole conduction) region. Typically, this can be accomplished by one or more methods such as formation of a junction by diffusion of dopants, ion implantation of dopants, or the growth of contiguous n-type and p-type layers. These methods, however, generally require the use of complex equipment and extensive processing steps. It follows then that the fabrication of typical microwave integrated circuit devices can be relatively expensive.

An alternative and relatively more simple junction formation technique involves forming a Schottky barrier, whereby a metal is deposited on a semiconductor layer. Because of some potentially adverse metal-semiconductor reactions, and sensitivities to surface conditions and small voltage steps obtainable particularly with n-type materials, the yield and quality of these devices has, until recently, been impractical for many microwave applications.

In recent years, advances in MMIC design technology, including the use of gallium arsenide (GaAs) as a semiconductor, have limited the use of conventional automated equipment in microwave circuit assembly facilities. Microwave circuit assembly is considered to be very complex because gallium arsenide integrated circuits are significantly smaller and more delicate than conventional silicon integrated circuits. It is believed that no automated high volume fabrication or assembly facility currently exists for gallium arsenide integrated circuits. However, despite the manufacturability disadvantages of selecting gallium arsenide in lieu of silicon or other materials as the semiconductor substrate, numerous advantages are also apparent. The major advantage being the gallium arsenide integrated circuits have faster switching speeds of logic gates and significantly lower parasitic capacitance to ground.

The mechanical properties of gallium arsenide are well below that of silicon in hardness, fracture toughness and Young's modulus. Gallium arsenide is very brittle, about one-half as strong as silicon. This means that a much greater degree of process control is mandated to ensure reliability and repeatability necessary to cost-effectively produce gallium arsenide MMIC.

Additionally, gallium arsenide MMIC technology requires that the electrical grounding paths be very short. Therefore, gallium arsenide wafer thinning is employed to reduce the thickness of MMIC wafers to approximately 0.004" to 0.010" thick. In comparison, conventional integrated circuits have a semiconductor wafer thickness in the range of 0.015" to 0.030". Following the wafer thinning processing, a through-substrate via etching process is then performed to form a ground path directly through the chip to circuitry loaded on the top of the MMIC surface. The top surface of the MMIC has electrical conductors that delineate circuitry capable of operating at microwave frequencies. In many cases, these conductors are made into structures called air bridge crossovers. Typically, air bridges are located at the field effect transistors (FETs) and at various capacitors located on the MMIC surface. Routinely, the air bridge crossovers are densely packed in close proximity on the MMIC top surface. These air bridge crossovers can be easily damaged and as such are not accessible to conventional high rate circuit assembly techniques.

In general terms, die-attach is the process of bonding an integrated circuit chip to a substrate to produce an electrical interface therebetween. Commonly utilized substrates include printed wire boards (PWB), thin film gold metallized alumina and multilayer alumina header packages. Conventional bonding mediums include electrically conductive epoxies or solder alloys selected from metals of the type including indium, lead, tin, gold, silver, platinum, palladium or combinations thereof. Moreover, solder die-attach is the process of metallurgically bonding the integrated circuit chip to the substrate or readout device. The metallurgical bond provides an electrical interface between the components and acts to dissipate heat during thermal operational cycling. Vias extending through the semiconductor wafer provide an electrical communication path between circuitry disposed on the top surface of the MMIC and the substrate.

The present invention is directed to an improved ground plane metallization layer provided on the bottom surface of a integrated circuit chip, and more preferably a MMIC chip, for solder attachment to a substrate. Until recently it was believed that completely filling the vias of gallium arsenide MMICs with solder during die-attach was desirable because the solder "post" could dissipate a greater amount of heat from components electrically interfaced with the vias. However, it has been discovered that solder-filled chip vias cause reliability problems during operational temperature cycling. The thermal coefficients of expansion of the solder alloy, the gallium arsenide MMIC chip and commonly employed substrates are not matched sufficiently to inhibit cracks from forming at the vias and propagating through the MMIC chip. In fact, in some instances the solder completely penetrates the via and flows onto the top surface of the MMIC. Such undesirable failure modes generate excessive scrap which has made application of gallium arsenide MMICs impractical.

Another disadvantage of conventional solder die-attach processing includes the excessively manual method of positioning solder preforms in accurate alignment between a MMIC chip and a substrate prior to reflowing the solder. Inaccurate positioning produces non-uniform interface layers which results in reduced electrical performance.

Among the advantages of the present invention is that relatively efficient die-attach processing of semiconductor devices, including microwave integrated circuits, can be realized without specialized equipment or handling requirements. The improved MMIC design is relatively inexpensive and can be carried out successfully utilizing standard solder die-attach technology. The present devices exhibit improved reliability in operation and in manufacturability as compared to conventional integrated circuits. Therefore, it is an object of the present invention to provide an improved MMIC backside metallization system which will preferentially "de-wet" the solder at the solder-via interface or bondline. Such preferential "de-wetting" substantially increases MMIC reliability by eliminating failure modes associated with via cracking.

SUMMARY OF THE INVENTION

An improved semiconductor device for use in microwave integrated circuits is disclosed. The semiconductor device is adapted for solder attachment to a substrate to produce an electrical interface therebetween. The device includes a semiconductor wafer having at least one via extending therethrough. The wafer includes a backside metallization layer that inhibits solder bonding within the via while promoting solder bonding outside of the via.

BRIEF DESCRIPTION OF THE DRAWINGS

Various advantages of the present invention will become apparent to one skilled in the art upon reading the following specification and references to the drawings in which.

DETAILED DESCRIPTION OF THE PREFERRED EMBODIMENTS

Figure 1:
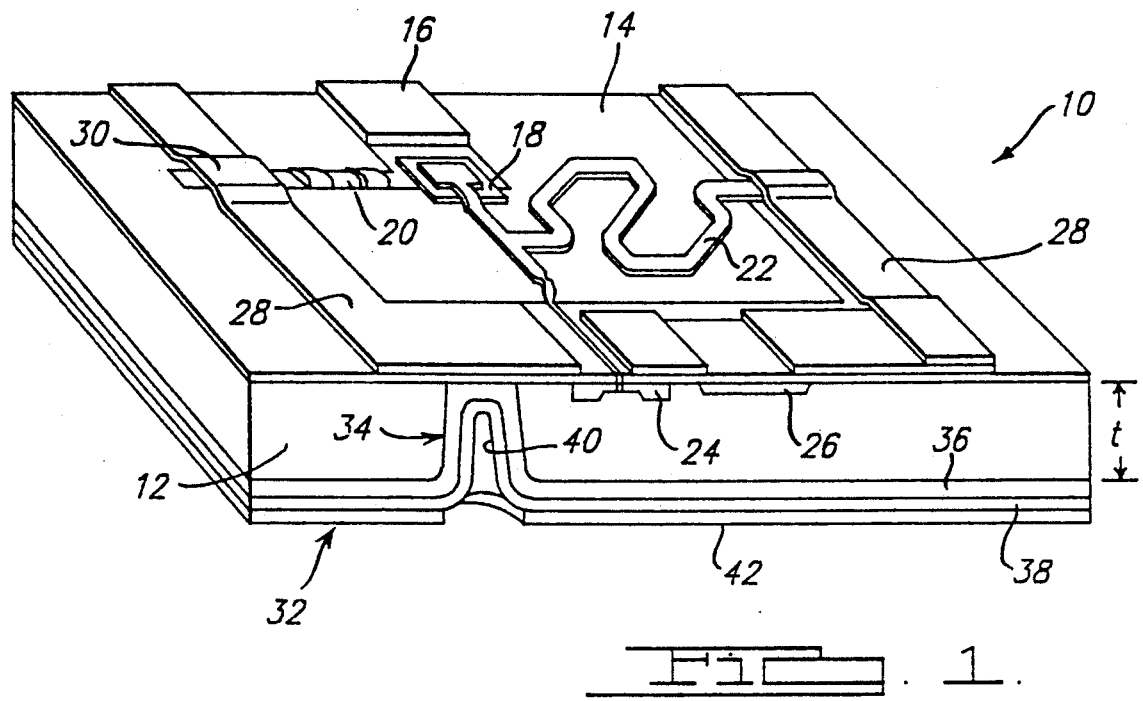
FIG. 1 is a perspective view of an improved MMIC back side metallization system for preferentially "de-wetting" the solder/via interface according to a first preferred embodiment.

Unless otherwise noted herein, like components have like reference numerals throughout the drawing. Typically, integrated circuit chips for use in electromagnetic systems have been fabricated from silicon having an average semiconductor wafer thickness ranging between 0.015" through 0.030". Conventionally, relatively thin passivation layers have been provided on the surface of the integrated circuits which permit a direct die contact with the surface of the integrated circuit during pick and place positioning and assembly. Likewise, the backside or underside surface of such chips are fabricated to include a ground plane metallization layer which is conducive to metallurgical bonding to conventionally employed readout devices, printed boards or substrates. The metallurgical bond provides an electrical interface between the chip and the substrate and, as such, must be made of an electrically conductive material. Unfortunately, conventional fabrication and processing methods are generally not compatible with gallium arsenide (GaAs) monolithic microwave integrated circuits (MMICs) that are used in microwave frequency modules. Gallium arsenide is very brittle, about only one half the strength of silicon. To provide optimal performance, electrical grounding paths of the gallium arsenide MMICs must be extremely short. As such, wafer thinning of the gallium arsenide layer is employed to reduce the thickness "t" of the MMIC wafer to approximately 0.004" to 0.007" of thickness.

It is known that conventional solder die-attach processes are unreliable for attaching gallium arsenide MMICs to substrates. Excessive scrap is generated because of the sensitivity of gallium arsenide wafers to premature fracture. Fracture is most prominent during initial pick and place handling during die-attach processing and following initial thermal cycling of the MMIC while in operation. Likewise, improper MMIC solder die-attach can result in reduced electrical and mechanical performance. Therefore, voiding along the bond interface must be kept to a minimum to maintain the uniform and continuous electrically and thermally conductive paths.

Current (prior art) chip technology utilizes a groundplane metallization layer fabricated from an electrically conductive metal. A thin film metallized and/or plated layer of gold is the material of choice for most integrated circuit applications. This metallization layer promotes "wetting" of a solder alloy applied thereon during solder die-attach processing. That is, the metallized layer permits the solder to uniformly flow across the bottom surface of the chip during die-attachment to provide a continuous void-free bond between a MMIC chip and a substrate. Routinely a plurality of through-chip vias extending through the wafer are provided to define electrically conductive ground paths from the parent substrate or printed circuit. In like fashion, the vias are also coated with the metallization layer deposited thereon to permit the solder material to bond directly to the via surface. As previously detailed, such a metallization layer fabrication produces "solder posts" during solder die-attach processing which are largely responsible for undesirable cracking of the MMIC chip.

Referring now to FIG. 1, a representative monolithic microwave integrated circuit (MMIC) according to a first preferred embodiment is shown and generally designated as 10. The MMIC 10 is comprised of a semi-insulating wafer 12 which is preferably fabricated from gallium arsenide. On a top planar surface 14 of MMIC 10 various electrical circuits and components are provided. These include an input line 16, a silicon nitride dielectric 18, a thin film resistor 20, inductive lines 22, gallium arsenide field effect transistor (FET) 24, and implanted resistors 26. Further, top surface 14 of the MMIC 10 has electrical conductors 28, routinely fabricated from gold, that delineate the aforementioned circuitry, all of which are capable of operating at microwave frequencies. Typically, these gold conductors 28 are made into structures referred to as air bridge crossovers 30. The improvement over the prior art, to be hereinafter described, is directed to a unique backside metallization system 32 which permits the inside surface of vias 34 to remain preferentially "de-wetted" when solder is introduced therein.

The through chip vias 34 (one shown) are formed through chemical etching or reactive ion etching. Chemically etched vias are fairly large and have smooth surfaces. In contrast, the reactive ion etched vias are smaller and have rough and irregular surfaces. Reactive ion etching is desirable when tighter field effect transistor (FET) spacings are required on surface 14 of the MMIC chip.

The improved backside metallization system 32 is comprised of a plurality of electrically conductive layers. The cumulative effect of the various layers is to promote preferential "de-wetting" of solder within the vias so as to significantly reduce solder failures commonly associated with solder die-attach processing. More particularly, a first layer 36 defining a ground-plane metallization layer is deposited on the bottom surface of wafer 12 and within via 34 to form a continuous uniform layer. First layer 36 includes at least one film of sputtered metal, and preferably a plurality of successive layers of sputter titanium, platinum and gold having a total thickness of about one (1) micron. First layer 36 further includes an electroplated film of gold deposited on and contiguous with the last sputtered metal film and having a thickness of about one (1) micron. However, it is contemplated that other known ground-plane metallization layers can be readily utilized.

A second layer 38, preferably fabricated from electroplated nickel is deposited (plated) on and contiguous with first layer 36. Because nickel oxidizes very quickly in an ambient environment, the nickel layer 38 provides an oxidation layer on which the solder alloys, hereinafter to be detailed, will not wet. The preferably thickness of second layer 38 is at least about one (1) micron. Again, second layer 38 acts as a "barrier" plated surface which prevents electromigration of noble metals and inhibits "wetting" of the solder alloy material during solder die-attach processing. More particularly, the barrier layer 38 prevents solder from wetting inside surface 40 of via 34. While nickel is the preferred material of choice it is to be understood that any metal, either pure or oxidized, can be used which preferentially de-wets the solder deposited thereon.

A third electrically conductive layer is designated as numeral 42. Preferably third layer 42 is fabricated from an electroplated gold which is deposited on nickel barrier layer 38 to define a generally planar bottom surface of MMIC 10. Third layer 42 is not deposited within via 34 but is terminated adjacent the peripheral edge of via 34. In this manner, third layer 42 promotes wetting outside via 34 during solder die-attach processing.

Solder die-attach processing includes bonding MMIC 10 to another substrate, such as an alumina substrate (not shown), using an electrically conductive metallic solder alloy. The preferable solder alloy compositions for application to ground-plane metallization systems employing nickel as the non-wettable "barrier" layer include 80/20 gold-tin and 50/50 lead-indium. Solder die-attachment is preferable in applications requiring dissipation of heat generated during high duty cycle operation of MMIC 10.

While the MMIC illustrated in FIG. 1 is representative, it is not intended to limit the invention disclosed herebefore. Any integrated circuit configuration, regardless of componentry or application, is susceptible to adaptation of the present invention.

Figure 2:
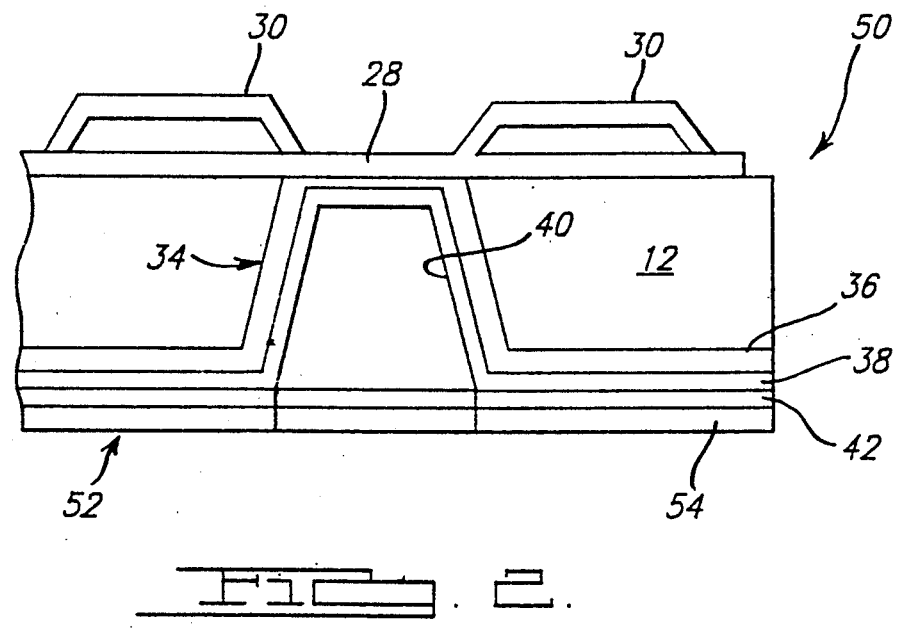
FIG. 2 is an enlarged partial cross-sectional view of a second preferred embodiment of the present invention.

In reference now to FIG. 2, an improved MMIC 50 in accordance with a second preferred embodiment is illustrated in greater detail. MMIC 50 includes a plurality of through chip vias 34 (one shown) located in close proximity to air bridges 30. A bottom planar surface 52 includes an improved ground-plane metallization system consisting of a plurality of electrically conductive layers. As previously described, the cumulative effect of the various layers is to promote preferential "de-wetting" of the vias to significantly reduce solder failures commonly associated with solder die-attach processing. Layers 36, 38 and 42 are identical to that described in reference to FIG. 1. However, the second embodiment is directed toward a MMIC device which eliminates the need to precisely locate solder preforms prior to solder die-attach processing. More particularly, a fourth layer 54 of solder material is pre-deposited on third layer 42 to a thickness of 0.0005" "to about 0.002". During die-attach when the solder is heated to its reflow temperature, layer 54 will flow along the bottom surface of MMIC 50 to bond the device to a substrate. Due to the non-wettable surface 40, the pre-deposited solder layer 54 will not flow into via 34. Deposition of a layer of solder alloy prior to die-attach processing promotes improved reliability in the bond thickness and uniformity. As such improper electrical interfaces are minimized while substantially simplifying die-attach processing.

Gallium arsenide wafers cannot withstand even the mildest fluxes during solder die-attachment so the solder materials must be reflowed on a hot plate in a nitrogen purged dry-box without flux prior to die-attach processing. The thermal coefficient of expansion between the gold-tin solder alloy ($16 \times 10(-6)$ in/in C), the gallium arsenide wafer ($5.7 \times 10(-6)$ in/in C), and the substrate, preferably alumina ($7.0 \times 10(-6)$ in/in C) are not matched closely enough to prevent cracking of MMIC vias 34 when conventional ground plane metallization attachment methods are employed. However, in light of the improved ground metallization system illustrated in FIGS. 1 and 2, the effect of differences in thermal coefficients of expansion can be minimized, if not eliminated, by preferentially de-wetting of the solder/via interface.

The improved MMIC designs permits utilization of currently available solder die-attach equipment. More particularly, specific emphasis is placed on the ability to produce the MMIC circuits using existing fully automated assembly and test systems. Additionally, it is contemplated that the MMICs will be assembled within a computer integrated manufacturing (CIM) facility to afford a high level of process repeatability and to facilitate data collection.

Although the invention has been described with particular reference to certain preferred embodiments thereof, variations and modifications can be effected within the spirit and scope of the following claims.

What is claimed is:

1. A semiconductor device adapted to be metallurgically bonded to a substrate to provide an electrical interconnection therebetween, comprising:
   a semiconductor wafer having first and second major surfaces, said second major surface defining at least one via extending through said wafer to said first major surface;
   a ground-plane metallization layer on said second major surface of said semiconductor wafer;
   first layer means formed on said ground-plane metallization layer at least within said via for preventing bonding of a solder material with said via;

said first layer means comprising a layer of a first conductive material formed on the ground-plane metallization layer of said wafer and on the surface of said via; and second layer means formed on a portion of said first layer means and terminating at the peripheral edge of said via for bonding said semiconductor wafer to said substrate.

2. A semiconductor device as in claim 1 wherein said first conductive material is a relatively thin layer of electroplated nickel, said nickel layer deposited on said ground-plane metallization layer of said semiconductor wafer and on said surface of said via.

3. A semiconductor device as in claim 2 wherein said second layer means comprises a layer of a second conductive material formed on said first conductive material with said layer of second conductive material terminating at the peripheral edge of said via.

4. A semiconductor device as in claim 3 wherein said second conductive material is a relatively thin layer of metallized gold deposited on and contiguous with said nickel layer, said metallized gold layer terminating adjacent a peripheral edge of said via.

5. A semiconductor device as in claim 4 wherein said semiconductor wafer is fabricated from gallium arsenide, and wherein said solder material is an electrically conductive metal alloy substantially incapable of wetting on said nickel layer within said via.

6. A semiconductor device as in claim 5 further comprising a layer of said solder material being formed on and contiguous with said metallized gold layer.

7. A semiconductor device adapted to be bonded to a substrate, comprising:

a semiconductor wafer;

an integrated circuit disposed on a first surface of said semiconductor wafer;

at least one via extending transversely through said semiconductor wafer from a second surface thereof to said first surface; and a ground-plane layer provided on said semiconductor wafer second surface having a first conductive material deposited on the surface of said via such that said first conductive material interfaces with said integrated circuit, and a second conductive material deposited on said semiconductor wafer second surface adjacent said first conductive material and terminating at a peripheral edge of said via;

wherein said first conductive material inhibits wetting of a solder material upon contact with said surface of said via, and said second conductive material permits wetting of said solder material with said ground-plane layer so as to electrically interconnect said semiconductor wafer to said substrate.

8. A semiconductor device according to claim 7 wherein said first conductive material is a barrier plate fabricated from nickel.

9. A semiconductor device according to claim 8 wherein said nickel barrier plate is electroplated as a continuous layer upon said second surface of said wafer and upon said surface of said via.

10. A semiconductor device according to claim 7 wherein said first conductive material comprises a relatively thin metallization layer deposited on said second surface of said semiconductor wafer and a relatively thin barrier layer of nickel deposited on and contiguous with said metallization layer.

11. A semiconductor device according to claim 7 wherein said second conductive material is a relatively thin layer of electroplated gold.

12. A semiconductor device according to claim 7 wherein said semiconductor wafer is gallium arsenide and said semiconductor device is a microwave integrated circuit device.

* * * * *